United States Patent
Tamayama et al.

(10) Patent No.: US 10,959,357 B2
(45) Date of Patent: Mar. 23, 2021

(54) CIRCUIT BLOCK ASSEMBLY

(71) Applicant: Murata Manufacturing Co., Ltd., Nagaokakyo (JP)

(72) Inventors: Takeaki Tamayama, Nagaokakyo (JP); Akihiro Motoki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/668,451

(22) Filed: Oct. 30, 2019

(65) Prior Publication Data

US 2020/0068751 A1 Feb. 27, 2020

Related U.S. Application Data

(63) Continuation of application No. PCT/JP2018/032351, filed on Aug. 31, 2018.

(30) Foreign Application Priority Data

Sep. 7, 2017 (JP) .............................. JP2017-172386

(51) Int. Cl.
*H05K 9/00* (2006.01)
*H05K 7/20* (2006.01)
(Continued)

(52) U.S. Cl.
CPC ........... *H05K 9/0024* (2013.01); *H01L 23/36* (2013.01); *H01L 23/3672* (2013.01);
(Continued)

(58) Field of Classification Search
CPC ....... H05K 9/0022–0024; H05K 1/142; H05K 1/247; H05K 1/148; H05K 1/188; H05K 7/2039

See application file for complete search history.

(56) References Cited

U.S. PATENT DOCUMENTS 5,168,348 A * 12/1992 Chu ...................... H01L 23/367
257/713
5,343,940 A * 9/1994 Jean .................... F28D 15/0241
165/104.33
(Continued)

FOREIGN PATENT DOCUMENTS

JP S52137954 U 10/1977
JP S6042432 A 3/1985
(Continued)

OTHER PUBLICATIONS

International Search Report issued in PCT/JP2018/003235, dated Mar. 13, 2018.
(Continued)

*Primary Examiner* — Robert J Hoffberg
(74) *Attorney, Agent, or Firm* — Arent Fox LLP (57) ABSTRACT

A circuit block assembly is provided that includes circuit blocks that each include a circuit board and a semiconductor element that is disposed on a first main surface of the circuit board. Moreover, each of the circuit blocks includes a metal heat spreader that is connected to the semiconductor element directly or by a thermally conductive member interposed therebetween. A thermally conductive sheet is provided that is thermally connected to the heat spreader. The thermally conductive sheet has a specific electrical resistance higher than a specific electrical resistance of the heat spreader.

20 Claims, 5 Drawing Sheets

(51) Int. Cl.
  *H01L 23/427* (2006.01)
  *H05K 1/02* (2006.01)
  *H01L 23/36* (2006.01)
  *H01L 23/367* (2006.01)

(52) U.S. Cl.
  CPC ......... *H01L 23/427* (2013.01); *H05K 1/0203* (2013.01); *H05K 7/2039* (2013.01); *H05K 7/20154* (2013.01); *H05K 7/20336* (2013.01)

(56) References Cited

U.S. PATENT DOCUMENTS

| | | | |
|---|---|---|---|
| 9,324,678 B2 | 4/2016 | Ganesan et al. | |
| 9,449,735 B2 | 9/2016 | Chiba et al. | |
| 9,591,758 B2* | 3/2017 | Aleksov | H01L 25/50 |
| 9,682,522 B2 | 6/2017 | Baghdadi et al. | |
| 10,036,597 B2* | 7/2018 | De Troz | H01L 23/427 |
| 10,132,478 B2* | 11/2018 | Vasylyev | F21V 21/14 |
| 10,436,425 B1* | 10/2019 | Vasylyev | G02B 6/0068 |
| 10,667,430 B2* | 5/2020 | Inagaki | H05K 7/20336 |
| 10,830,421 B2* | 11/2020 | Vasylyev | F21V 17/007 |
| 2002/0189793 A1* | 12/2002 | Noda | F28D 15/046 |
| | | | 165/104.26 |
| 2014/0097389 A1 | 4/2014 | Chiba et al. | |
| 2015/0062840 A1 | 3/2015 | Kim | |
| 2015/0128359 A1 | 5/2015 | Baghdadi et al. | |
| 2015/0282321 A1* | 10/2015 | Aleksov | H01L 25/50 |
| | | | 174/254 |
| 2016/0227876 A1 | 8/2016 | Le et al. | |
| 2017/0283575 A1 | 10/2017 | Akuta et al. | |
| 2018/0155518 A1 | 6/2018 | Koshita et al. | |
| 2019/0157746 A1* | 5/2019 | Ishizuka | H01Q 13/10 |
| 2019/0271511 A1* | 9/2019 | Kishimoto | F28D 15/02 |
| 2020/0003501 A1* | 1/2020 | Wakaoka | F28D 15/046 |
| 2020/0144223 A1* | 5/2020 | Tamayama | H01L 25/00 |
| 2020/0343155 A1* | 10/2020 | Kiyonaga | H01L 23/29 |

FOREIGN PATENT DOCUMENTS

| | | | | |
|---|---|---|---|---|
| JP | 2006013217 A | 1/2006 | | |
| JP | 2008270296 A | 11/2008 | | |
| JP | 2013131561 A | 7/2013 | | |
| JP | 2014077045 A | 5/2014 | | |
| JP | 2014206891 A | 10/2014 | | |
| JP | 2015523251 A | 8/2015 | | |
| JP | 2015213096 A | 11/2015 | | |
| JP | 2016141153 A | 8/2016 | | |
| JP | 2016190989 A | 11/2016 | | |
| WO | 2013172449 A1 | 11/2013 | | |
| WO | WO-2014021046 A1 * | 2/2014 | ......... | H01L 23/367 |
| WO | 2016052112 A1 | 4/2016 | | |
| WO | 2016151916 A1 | 9/2016 | | |
| WO | 2016194737 A1 | 12/2016 | | |

OTHER PUBLICATIONS

Written Opinion of the International Searching Authority issued in PCT/JP2018/003235, dated Mar. 13, 2018.

* cited by examiner

CIRCUIT BLOCK ASSEMBLY

CROSS REFERENCE TO RELATED APPLICATIONS

The present application is a continuation of PCT/JP2018/032351 filed Aug. 31, 2018, which claims priority to Japanese Patent Application No. 2017-172386, filed Sep. 7, 2017, the entire contents of each of which are incorporated herein by reference.

TECHNICAL FIELD

The present invention relates to a circuit block assembly.

BACKGROUND

The structure of an electronic device, such as a mobile device, that has been used in recent years includes printed circuit boards (i.e., circuit blocks) that are modularized for every function and that are connected to each other with a flexible cable as discussed, for example, in Patent Documents 1 and 2 (identified below). Such a structure enables arrangement of each circuit block to be changed and increases the degree of freedom of design. Accordingly, the structure is useful for flexibility of an electronic device such as a wearable device.

With such existing structures, however, heat that is generated in each circuit block remains in a small circuit block. Accordingly, generation of heat is likely to be a problem unlike an existing mother board that has a relatively large size. This problem is particularly conspicuous in a circuit block in which a power system is also equipped with a semiconductor element.

Patent Document 1: U.S. Pat. No. 9,324,678.
Patent Document 2: U.S. Patent Application Publication No. 2015/0062840.
Patent Document 3: International Publication No. 2016/151916.

In order to solve the above problem, it is necessary to improve the heat dissipation of each circuit block. For example, Patent Document 3 discloses the use of a heat spreader composed of a metal. In some cases, however, the use of a common heat spreader of the circuit blocks causes a radio frequency noise to be transmitted from one of the circuit blocks to another circuit block via the heat spreader.

SUMMARY OF THE INVENTION

Accordingly, it is an object of the present invention to provide a circuit block assembly that is superior in heat dissipation and that enables a radio frequency noise to be inhibited from being transmitted.

Thus, to solve the above problems by inhibiting radio frequency noise from being transmitted and improving heat dissipation of each circuit block, the exemplary embodiments of the invention provide for heat spreaders composed of a metal to be disposed on respective circuit blocks. Moreover, the heat spreaders and a thermally conductive sheet that has a specific electrical resistance higher than that of the heat spreaders are connected to each other directly or with a thermally conductive member interposed therebetween.

Accordingly, a circuit block assembly is provided according to a first exemplary aspect of the present invention that includes circuit blocks each of which includes a circuit board and a semiconductor element that is disposed on a first main surface of the circuit board. Moreover, each of the circuit blocks includes a heat spreader that is composed of a metal and that is connected to the semiconductor element directly or a thermally conductive member interposed therebetween, and a thermally conductive sheet that is connected to the heat spreader directly or a thermally conductive member interposed therebetween. In addition, the thermally conductive sheet has a specific electrical resistance higher than a specific electrical resistance of the heat spreader.

In a second exemplary aspect of the present invention, an electronic device is provided that includes the circuit block assembly according to the present invention.

According to another exemplary embodiments of the present invention, a circuit block assembly is provided that includes circuit blocks each of which includes a circuit board and a semiconductor element that is disposed on a first main surface of the circuit board. Moreover, a heat spreader that is composed of a metal is thermally connected to the semiconductor element, and a thermally conductive sheet is connected to the heat spreader directly or a thermally conductive member interposed therebetween. This enables the circuit block assembly to inhibit a radio frequency noise from being transmitted and to improve heat dissipation.

DETAILED DESCRIPTION OF EXEMPLARY EMBODIMENTS

A circuit block assembly according to exemplary embodiments of the present invention will hereinafter be described in detail.

First Exemplary Embodiment

Figure 1:
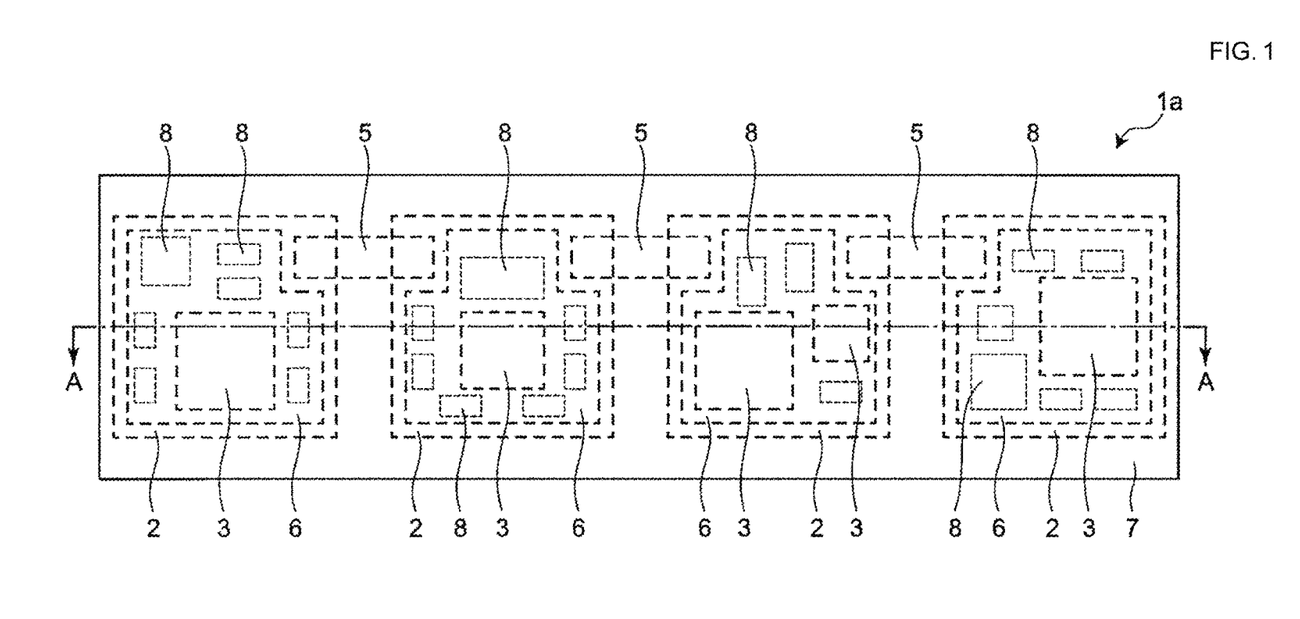
FIG. 1 is a plan view of a circuit block assembly 1a according to an exemplary embodiment.
Figure 2:
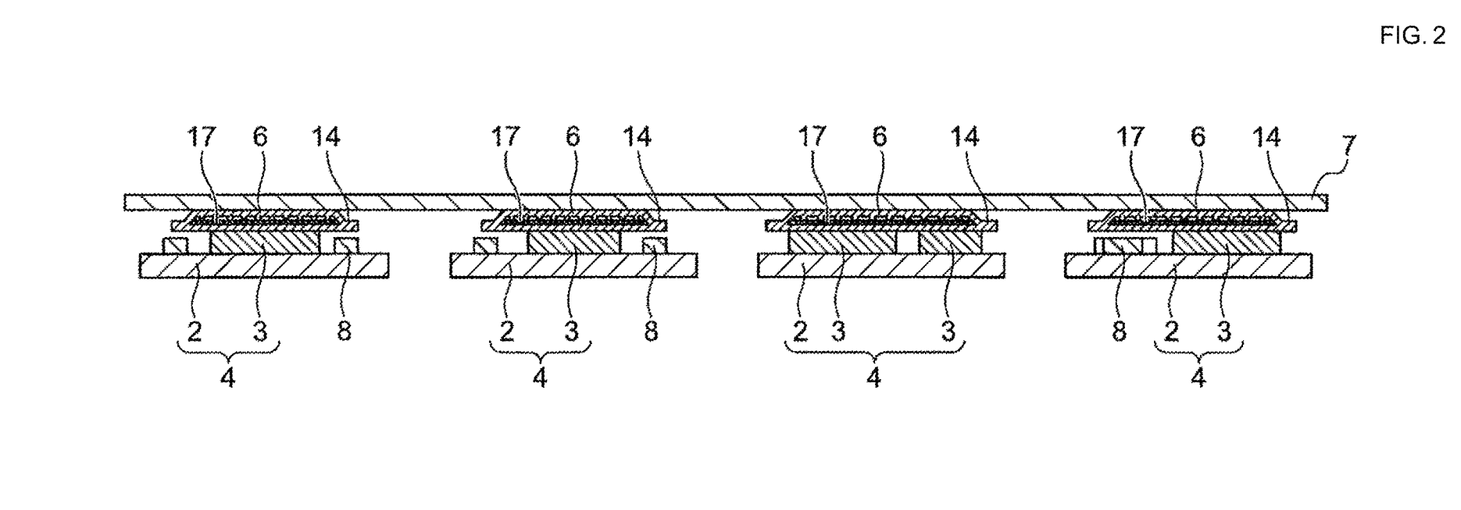
FIG. 2 is a sectional view of the circuit block assembly 1a illustrated in FIG. 1 taken along line A-A.

FIG. 1 illustrates a plan view of a circuit block assembly 1a according to the present embodiment. FIG. 2 illustrates a sectional view thereof.

As illustrated in FIG. 1 and FIG. 2, the circuit block assembly 1a according to the present embodiment includes a plurality of circuit blocks 4 that each include circuit boards 2 and semiconductor elements 3 that are disposed on first main surfaces of the circuit boards 2, flexible cables 5 that connect the circuit blocks to each other, heat spreaders 6 that are located above the circuit blocks 4 (in the thickness direction of circuit block assembly 1a), and a thermally conductive sheet 7 that is disposed above the heat spreaders 6 and that connects the heat spreaders 6 to each other. That is, the semiconductor elements 3 are located near first main surfaces of the heat spreaders 6, and the thermally conductive sheet 7 is located near second main surfaces of the heat spreaders 6 that opposes the first main surfaces. Moreover, the thermally conductive sheet 7 has a specific electrical resistance higher than the specific electrical resistance of the heat spreaders 6. The semiconductor elements 3 and the heat spreaders 6 are connected to each other directly or thermally conductive members are interposed therebetween and are thermally connected to each other. Likewise, the heat spreaders 6 and the thermally conductive sheet 7 are connected to each other directly or thermally conductive members are interposed therebetween and are thermally connected to each other.

In the circuit block assembly 1a, the semiconductor element 3 and the heat spreader 6 of each circuit block 4 are thermally connected to each other, and the heat spreader 6 is thermally connected to the thermally conductive sheet 7. Consequently, heat that is generated in the semiconductor element 3 rapidly diffuses over the entire heat spreader 6, and the thermally conductive sheet 7 subsequently diffuses the heat over a wider range. This effect of heat dispersion enables the circuit block assembly according to the exemplary embodiment to have a high heat dissipation as a whole. Since the thermally conductive sheet 7 has a specific electrical resistance higher than the specific electrical resistance of the heat spreaders 6, radio frequency noise can be inhibited from being transmitted between the circuit blocks. That is, it can be said that, in the circuit block assembly 1a according to the exemplary embodiment of the present invention, the circuit blocks 4 are thermally connected to each other but are electrically isolated from each other.

In the exemplary embodiment, each circuit block 4 includes the circuit board 2 and the semiconductor element 3 that is disposed on the first main surface of the circuit board 2.

It is noted that each circuit board 2 is not particularly limited provided that the circuit board is typically used in the circuit block, and is preferably a printed circuit board.

Moreover, each semiconductor element 3 is not particularly limited, and examples thereof include an APU (Accelerated Processing Unit), a CPU (Central Processing Unit), a PMIC (Power Management Integrated Circuit), and a semiconductor integrated circuit that generates heat such as a memory.

It is also noted that the number of the semiconductor elements 3 that are disposed on each circuit board 2 is not particularly limited and may be 1 or 2 as illustrated, or 3 or more.

As further shown, the circuit blocks 4 can include other electric elements 8, examples of which include a wiring line, a terminal, and an electric element, in addition to the circuit boards 2 and the semiconductor elements 3. It should be appreciated that the other electric elements 8 are not essential components and may not be provided. Moreover, the number of the other electric elements 8 is not particularly limited when provided.

The circuit block assembly according to the present invention includes the circuit blocks 4. It is also noted that the number of the circuit blocks 4 is not particularly limited provided that the number is 2 or more. It is not necessary for the semiconductor elements to be included in all of the circuit blocks.

In FIG. 1, the flexible cables 5 electrically connect the circuit blocks 4 to each other. The electrical connection between the circuit blocks 4 is not essential and is not particularly limited.

In an exemplary aspect, each flexible cable 5 includes a thin flexible resin sheet such as a polyimide sheet and a connection wiring line. The flexible cable may include an electronic component such as a capacitor in addition to the connection wiring line. The circuit boards 2 and the flexible cables 5 are connected to each other with connector components interposed therebetween or conductive joining materials such as solder interposed therebetween.

Moreover, the heat spreaders 6 are thermally connected to the semiconductor elements 3. Since the heat spreaders are thermally coupled to the semiconductor elements, heat that is generated in the semiconductor elements can be rapidly diffused over the entire heat spreaders. In FIG. 1 and FIG. 2, the heat spreaders 6 are located above the semiconductor elements 3.

According to a preferred aspect, as illustrated in FIG. 1, the heat spreaders are thermally connected to the entire upper surfaces of the semiconductor elements. As illustrated in FIG. 1, the heat spreaders are preferably disposed so as to cover the entire upper surfaces of the semiconductor elements.

In an exemplary aspect, the heat spreaders 6 and the semiconductor elements 3 can be thermally connected to each other by bringing these components into direct contact with each other. In another exemplary aspect, thermally conductive members, examples of which include thermal grease and a metal member such as solder, can be interposed therebetween. It is also noted that the thermal grease can be a viscous substance that has a high thermal conductivity, an example of which is obtained by dispersing particles of a metal or metal oxide that has a high thermal conductivity into modified silicone. The above structure in which the heat spreaders 6 and the semiconductor elements 3 are thermally connected to each other by interposing other thermally conductive members, examples of which include thermal grease and a metal member such as solder, therebetween corresponds to a structure in which the "heat spreaders 6 are located above the semiconductor elements 3". When the heat spreaders 6 and the semiconductor elements 3 are thermally connected to each other by interposing other thermally conductive members, examples of which include thermal grease and a metal member such as solder, therebetween as above, the degree of thermal connection is equal to or more than that in the case of direct connection therebetween. The reason is that, in the case of the direct connection between the heat spreaders 6 and the semiconductor elements 3, there is a possibility that a small gap is formed therebetween. Even when a gap is created between the heat spreaders 6 and the semiconductor elements 3, the thermal connection with, for example, thermal grease or solder interposed therebetween enables the gap to be filled with the thermal grease or the solder. Accordingly, the degree of the thermal connection can be equal to or more than that in the case of the direct connection between the heat spreaders 6 and the semiconductor elements 3.

In an exemplary aspect, each heat spreader 6 is composed of a metal, which means not only that the entire heat spreader is composed of the metal, but also that a main part of the heat spreader is composed of the metal. For example, when the heat spreader is merely a metal plate, the entire heat spreader can be substantially composed of a metal. Alternatively, when the heat spreader is a vapor chamber described later, for example, it is only necessary for a housing, which is the main part, is substantially composed of a metal.

Each heat spreader 6 preferably has a plane shape. The heat spreader 6 contains the semiconductor element 3 in a plan view and covers electronic components that are mounted on the corresponding circuit board 2. It is noted that the "plane shape" includes a plate shape and a sheet shape and means a shape with the length and the width being considerably greater than the height (i.e., the thickness).

Examples thereof include a shape the length and the width of which are equal to or more than ten times, preferably hundred times the thickness.

Each heat spreader 6 preferably covers all of the components that are mounted on the corresponding circuit board 2, but does not necessarily cover all of the components. The planar shape of the heat spreader is a shape having a notch such that the heat spreader does not overlap the flexible cables 5 in the thickness direction. Since the heat spreader does not overlap the flexible cables, electrical characteristics when the flexible cables bend can be inhibited from varying.

In an exemplary aspect as shown in FIG. 1 and FIG. 2, the other electric elements 8 are not in contact with the heat spreaders 6. However, in an alternative aspect, the other electric elements 8 may be in contact with the heat spreaders 6.

When the other electric elements 8 generate heat, it is preferable that the other electric elements 8 are thermally connected to the heat spreaders 6. The thermal connection between the other electric elements, which generate heat, and the heat spreaders enables heat that is generated by the electric elements other than the semiconductor elements to be rapidly diffused, and the heat dissipation of the entire circuit block assembly is further improved.

The metal of which each heat spreader 6 is composed is not particularly limited, and examples thereof include copper, nickel, aluminum, magnesium, titanium, iron, and alloys that contain these as the main component, and the metal is particularly preferably copper.

Moreover, the thickness of each heat spreader 6 is not particularly limited but is preferably no less than 100 μm and no more than 11000 μm, more preferably no less than 200 μm and no more than 600 μm.

In an exemplary aspect, as illustrated in FIG. 1 and FIG. 2, each heat spreader 6 can be a vapor chamber. The use of the vapor chamber as the heat spreader enables the heat dissipation of the circuit block assembly according to the present invention to be further improved. In addition, the vapor chamber has cushioning characteristics due to the flexible housing and interior space thereof, and can function as a shock absorber.

It is noted that the vapor chamber that can be used for the present invention is not particularly limited provided that the vapor chamber has a planer shape and includes the housing composed of a metal.

An example of the vapor chamber is a vapor chamber that includes a planer shaped housing having an interior space, a wick that is located in the interior space, and a working medium that is enclosed in the interior space.

Figure 3:
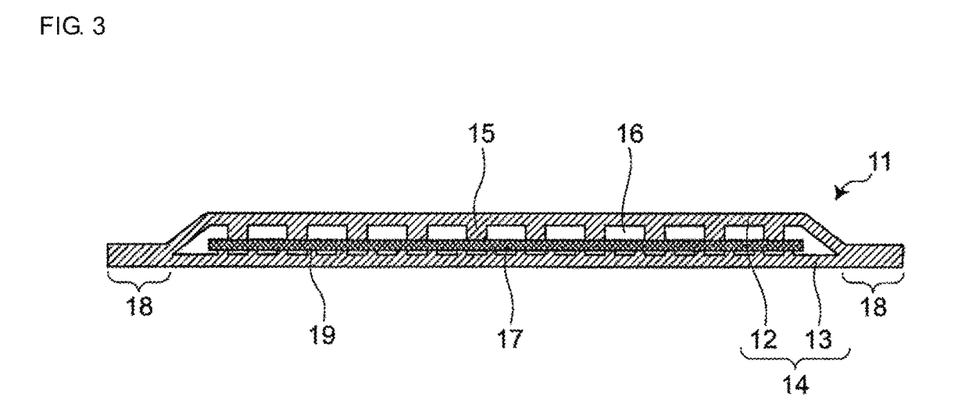
FIG. 3 is a sectional view of a vapor chamber that is used in the circuit block assembly 1a illustrated in FIG. 1.

According to an exemplary aspect, a vapor chamber 11 is illustrated in FIG. 3 and includes a housing 14 that includes a first sheet 12 and a second sheet 13 that have outer edge portions 18 joined to each other and that face each other. Moreover, the vapor chamber 11 includes supports 15 that are disposed between the first sheet 12 and the second sheet 13 and that support these from inside, a wick 17 that is disposed in an interior space 16 of the housing 14, and a working medium that is enclosed in the interior space 16 of the housing 14.

In an exemplary aspect, the thickness of the vapor chamber 11 is preferably no less than 100 μm and no more than 600 μm, more preferably no less than 200 μm and no more than 500 μm.

Moreover, the material of the first sheet 12 and the material of the second sheet 13 are preferably a metal, and examples thereof include copper, nickel, aluminum, magnesium, titanium, iron, and alloys that contain these as the main component, and the material is particularly preferably copper. The material of the first sheet 12 and the material of the second sheet 13 may be the same or may differ from each other but are preferably the same.

As further shown, the first sheet 12, or the second sheet 13, or both include projecting portions 19 or the supports 15 on a main surface that faces the interior space, or the projecting portions 19 and the supports 15 thereon. Since the sheet or the sheets have the projecting portions 19 and/or the supports 15, the working medium can be held between the projecting portions, and the amount of the working medium of the vapor chamber 11 according to the exemplary aspect can be readily increased. The increase in the amount of the working medium improves the ability of the vapor chamber to transport heat. The projecting portions 19 and/or the supports 15 correspond to portions the height of which is relatively greater than that of an adjacent portion and include a portion having a relatively great height as a result of a recessed portion, such as a groove, being formed on the main surface in addition to a portion projecting from the main surface.

According to the exemplary aspect, the height of each support 15 is greater than the height of each projecting portion 19. According to a refinement of the exemplary aspect, the height of the support 15 is preferably no less than 1.5 times and no more than 100 times, more preferably no less than 2 times and no more than 50 times, further preferably no less than 3 times and no more than 20 times, most preferably no less than 3 times and no more than 10 times the height of the projecting portion 19.

The height of each projecting portion 19 is not particularly limited but is preferably no less than 1 μm and no more than 100 μm, more preferably no less than 5 μm and no more than 50 μm, further preferably no less than 15 μm and no more than 30 μm. The amount of the working medium to be held can be increased by increasing the height of the projecting portion. A space in which vapor of the working medium moves can be widened by decreasing the height of the projecting portion. Accordingly, the ability of the vapor chamber to transport heat can be adjusted by adjusting the height of the projecting portion.

The distance between the projecting portions 19 is not particularly limited but is preferably no less than 1 μm and no more than 500 μm, more preferably no less than 5 μm and no more than 300 μm, further preferably no less than 15 μm and no more than 150 μm. Capillary action can be increased by decreasing the distance between the projecting portions. The transmittance can be increased by increasing the distance between the projecting portions.

The shape of each projecting portion 19 is not particularly limited but can be a columnar shape, a prismatic shape, a truncated cone shape, a truncated pyramid shape, or another shape. Moreover, the shape of the projecting portion 19 may be a wall shape, that is, a shape formed such that a groove is formed between the projecting portion and the projecting portion adjacent thereto.

It is noted that the projecting portions 19 are not required components for the vapor chamber 11 that is used for the present invention and may not be provided in an alternative aspect.

The supports 15 are configured to support the first sheet 12 and the second sheet 13 from inside the first sheet 12 and the second sheet 13 such that the distance between the first sheet and the second sheet remains at a predetermined distance. The supports 15 that are disposed inside the housing 14 inhibit the housing from deforming, for example, when the pressure in the housing is decreased or an external pressure is applied from the outside of the housing.

It is noted that the material of each support 15 is not particularly limited, and examples thereof include copper, nickel, aluminum, magnesium, titanium, iron, and alloys that contain these as the main component, and the material is particularly preferably copper. According to a preferred aspect, the material of the support is the same as the material of the first sheet, or the material of the second sheet, or both.

The height of each support 15 can be appropriately set depending on the desired thickness of the vapor chamber and is preferably no less than 50 µm and no more than 500 µm, more preferably no less than 100 µm and no more than 400 µm, further preferably no less than 100 µm and no more than 200 µm and is, for example, no less than 125 µm and no more than 150 µm. The height of the support means a height in the thickness direction of the vapor chamber (i.e., the height in the vertical direction in FIG. 3).

The shape of each support 15 is not particularly limited, but can be a columnar shape, a prismatic shape, a truncated cone shape, a truncated pyramid shape, or another shape.

Moreover, the thickness of each support 15 is not particularly limited provided that the support 15 has a strength that enables the housing of the vapor chamber to be inhibited from deforming. For example, the diameter of a substantially circular section of the support in a direction perpendicular to the height direction can be no less than 100 µm and no more than 2000 µm, preferably no less than 300 µm and no more than 1000 µm. The housing of the vapor chamber can be further inhibited from deforming by increasing the diameter of the substantially circular section of the support. The space in which vapor of the working medium moves can be widened by decreasing the diameter of the substantially circular section of the support.

Yet further, the arrangement of the supports 15 is not particularly limited but the supports 15 are preferably arranged at regular intervals, for example, in a lattice pattern such that the distance between the supports is constant. The supports that are arranged at regular intervals enable uniform strength to be ensured over the entire vapor chamber.

The number of the supports 15 and the distance between the supports 15 are not particularly limited but the number is preferably no less than 0.125 and no more than 0.5, more preferably no less than 0.2 and no more than 0.3 per area (square millimeter) of the main surface of each sheet that defines the interior space of the vapor chamber. The vapor chamber (or the housing) can be further inhibited from deforming by increasing the number of the supports. The space in which vapor of the working medium moves can be widened by decreasing the number of the supports.

The supports 15 may be formed integrally with the first sheet or the second sheet or may be manufactured separately from the first sheet and the second sheet and may be subsequently secured to a predetermined location.

In addition, the wick 17 is not particularly limited provided that the wick has a structure configured to move the working medium by the capillary action in the exemplary embodiment. In this regard, a capillary structure that exerts the capillary action to move the working medium is not particularly limited and may be a known structure used in an existing vapor chamber. For example, examples of the capillary structure include a microstructure having unevenness such as narrow holes, grooves, or projections, for example, a fiber structure, a groove structure, or a mesh structure.

Moreover, the thickness of the wick 17 is not particularly limited but can be, for example, no less than 5 µm and no more than 200 µm, preferably no less than 10 µm and no more than 80 µm, more preferably no less than 30 µm and no more than 50 µm.

The size and shape of the wick 17 are not particularly limited. However, for example, the wick 17 preferably has a size and a shape that enable the wick 17 to be continuously disposed from an evaporation portion to a condensation portion inside the housing.

It is noted that in the exemplary aspect as shown in FIG. 3, the wick 17 is an independent component but may be integrally formed with the housing. For example, in the vapor chamber illustrated in FIG. 3, the wick 17 may not be provided, and the projecting portions 19 that are formed on a wall surface of the housing can be used as a wick.

The working medium is not particularly limited provided that phase transition between gas and liquid can occur in the housing, and examples thereof can include water, alcohol, and CFC substitutes. According to an aspect, the working medium is an aqueous compound, preferably water.

According to another aspect, each heat spreader 6 may be a metal sheet. When the heat spreader 6 is the metal sheet, processibility is improved, and the strength of the heat spreader itself can be increased.

In FIG. 1 and FIG. 2, the heat spreaders 6 are disposed on all of the circuit blocks 4. The present invention, however, is not limited to this aspect. For example, the heat spreaders 6 may be disposed on only one or some of the circuit blocks 4. In this case, the heat spreaders 6 are preferably disposed on the circuit block 4 that generates a particularly large amount of heat.

In FIG. 1 and FIG. 2, all of the heat spreaders 6 have the same shape and are of the same kind. The present invention, however, is not limited to this aspect. For example, different kinds of the heat spreaders 6 that have different shapes may be used depending on the kinds of the circuit blocks 4 and the installation locations thereof.

In FIG. 2, each circuit block 4 includes the vapor chamber 11, which is not necessarily included in each circuit block 4. The vapor chamber 11 may be included in only one of the circuit block 4 that generates a particularly large amount of heat. Also with regard to the vapor chamber 11, the vapor chamber 11 may have a different shape depending on the circumstances.

The thermally conductive sheet 7 is a non-metallic sheet and has thermal conductivity. The thermal conductivity of the thermally conductive sheet in a plane direction is, for example, 500 W/(m·K) or more, preferably 1000 W/(m·K) or more, more preferably 1300 W/(m·K) or more.

According to the exemplary embodiment, the thermally conductive sheet 7 has a specific electrical resistance higher than the specific electrical resistance of the heat spreaders. Since the thermally conductive sheet 7 has a specific electrical resistance higher than the specific electrical resistance of the heat spreaders 6, the circuit blocks are electrically isolated from each other, and the radio frequency noise can be inhibited from being transmitted.

The specific electrical resistance of the thermally conductive sheet 7 is preferably equal to or more than the specific electrical resistance of aluminum and is, for example, $3.0 \times 10^{-8}$ Ω·m or more, preferably $1.0 \times 10^{-3}$ Ω·m or more, more preferably $1.0 \times 10^{2}$ Ω·m or more. As the specific electrical resistance of the thermally conductive sheet increases, the radio frequency noise can be more effectively inhibited from being transmitted.

According to a preferred aspect, the area of a surface of the thermally conductive sheet 7 that faces the heat spreaders 6 is larger than the total area of surfaces of the heat spreaders 6 that face the thermally conductive sheet 7. Since the area of the surface of the thermally conductive sheet 7 that faces the heat spreaders 6 is larger than the total area of the heat spreaders 6, the efficiency of diffusion of heat is improved, and the effect of heat dissipation is improved.

The area of the thermally conductive sheet 7 is preferably equal to or more than 1.5 times, more preferably 3.0 times, further preferably 5.0 times, most preferably 10.0 times the total area of the heat spreaders. As the area of the thermally conductive sheet 7 increases, the effect of heat dissipation is more effectively improved.

It is noted that the thickness of the thermally conductive sheet 7 is not particularly limited but is no less than 10 µm and no more than 1 mm, preferably no less than 20 µm and no more than 500 µm. Since the thickness of the thermally conductive sheet 7 is 10 µm or more, the effect of heat dissipation is more effectively improved. As the thickness increases, the effect of heat dissipation is more effectively improved. Since the thickness of the thermally conductive sheet 7 is 1 mm or less, space saving can be achieved. A decrease in the thickness is more advantageous to space saving.

According to a preferred aspect, the thermally conductive sheet 7 contains graphite. The thermally conductive sheet 7 is particularly preferably a graphite sheet. Moreover, the thermally conductive sheet 7 that contains graphite has a high thermal conductivity and a high specific electrical resistance and is advantageous to improvement in the heat dissipation and to inhibition of transmission of the radio frequency noise.

The graphite sheet is not particularly limited and can be obtained by expanding a polymeric graphite sheet and a natural graphite material. According to a preferred aspect, the graphite sheet is a polymeric graphite sheet. The use of the polymeric graphite sheet enables the effect of heat dissipation to be more effectively improved.

The polymeric graphite sheet is obtained in a manner in which a polymeric (for example, polyimide) film is heated at a very high temperature in an inert gas, the obtained precursor is further fired to rearrange carbon structure, and a crystal is grown. An example of such a graphite sheet is a PGS graphite sheet made by Panasonic Corporation.

The graphite sheet may be a multilayer body of graphite sheets that are stacked into multilayers with an adhesive layer or a cohesive layer interposed therebetween. The multilayer body of the graphite sheets is superior in heat dissipation. In addition, the multilayer body of the graphite sheets improves durability and prevents, for example, deformation and damage. The adhesive layer can be a polymeric film, an adhesive resin, an adhesive sheet, a cohesive resin, or a cohesive sheet.

In the circuit block assembly 1a according to the present embodiment, the semiconductor elements 3, the heat spreaders 6, and the thermally conductive sheet 7 may be thermally connected to each other by bringing these into direct contact with each other or by interposing other thermally conductive members, examples of which include thermal grease and a metal member such as solder, therebetween. As discussed above, the thermal grease can be a viscous substance that has a high thermal conductivity, an example of which is obtained by dispersing particles of a metal or metal oxide that has a high thermal conductivity into modified silicone. The above structure in which the semiconductor elements 3 and the heat spreaders 6 are thermally connected to each other by interposing other thermally conductive members, examples of which include thermal grease, a thermal pad, a thermal patch, thermal paste, and a metal member such as solder, therebetween as above corresponds to the structure in which the "heat spreaders 6 are located above the semiconductor elements 3". The above structure in which the heat spreaders 6 and the thermally conductive sheet 7 are thermally connected to each other by interposing other thermally conductive members, examples of which include thermal grease and a metal member such as solder, therebetween as above corresponds to the structure in which the "thermally conductive sheet 7 is located above the heat spreaders 6". When the semiconductor elements 3, the heat spreaders 6, and the thermally conductive sheet 7 are thermally connected to each other by interposing other thermally conductive members, examples of which include thermal grease and a metal member such as solder, therebetween as above, the degree of the thermal connection can be equal to or more than that in the case of the direct connection therebetween.

Second Exemplary Embodiment

Figure 4:
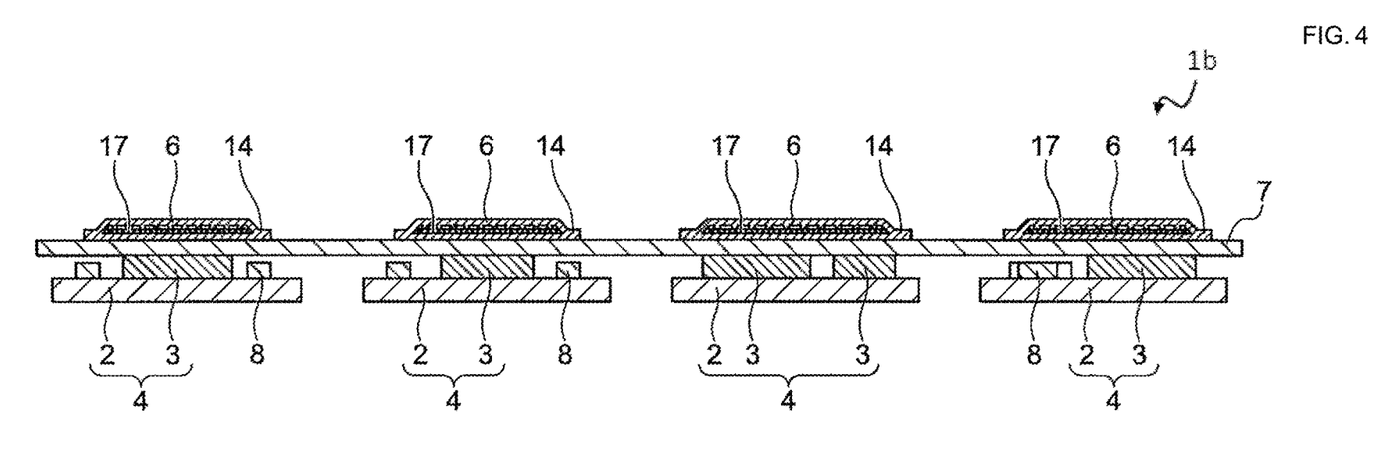
FIG. 4 is a sectional view of a circuit block assembly 1b according to another exemplary embodiment.

FIG. 4 illustrates a sectional view of a circuit block assembly 1b according to another exemplary embodiment.

As illustrated in FIG. 4, the circuit block assembly 1b according to the present embodiment is obtained by changing the positions of the heat spreaders 6 and the thermally conductive sheet 7 of the above circuit block assembly 1a. That is, the thermally conductive sheet 7 is located above the semiconductor elements 3, and the heat spreaders 6 are located above the thermally conductive sheet 7. In other words, the semiconductor elements 3 are located near the first main surface of the thermally conductive sheet 7, and the heat spreaders 6 are located near the second main surface of the thermally conductive sheet 7. The semiconductor elements 3 and the thermally conductive sheet 7 may be thermally connected to each other by interposing other thermally conductive members, examples of which include thermal grease and a metal member such as solder, therebetween, or may be in direct contact with each other. Moreover, the thermally conductive sheet 7 and the heat spreaders 6 may be thermally connected to each other by interposing other thermally conductive members, examples of which include thermal grease and a metal member such as solder, therebetween, or may be in direct contact with each other.

Third Exemplary Embodiment

Figure 5:
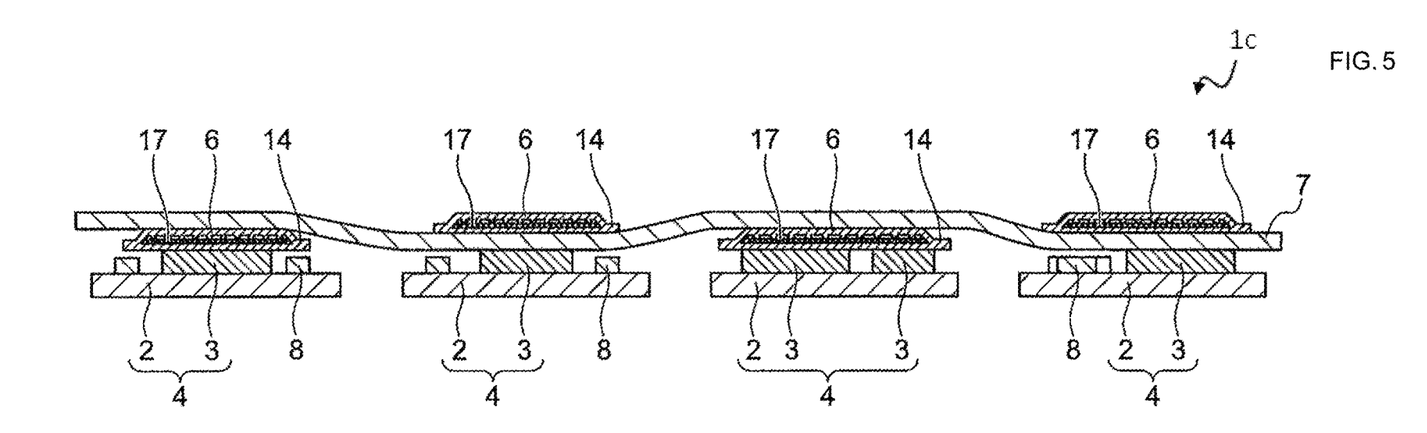
FIG. 5 is a sectional view of a circuit block assembly 1c according to another exemplary embodiment.

FIG. 5 illustrates a sectional view of a circuit block assembly 1c according to another exemplary embodiment.

As illustrated in FIG. 5, the circuit block assembly 1c according to the present embodiment is obtained by disposing the thermally conductive sheet 7 of the above circuit block assembly 1a above or below the heat spreaders 6. That is, in some of the circuit blocks, the heat spreaders 6 are located above the semiconductor elements 3, and the thermally conductive sheet 7 is located above the heat spreaders 6. In the other circuit blocks, the thermally conductive sheet 7 is located above the semiconductor elements 3, and the heat spreaders 6 are located above the thermally conductive sheet 7.

As illustrated in FIG. 5, the height position of the thermally conductive sheet 7 may differ for every circuit block 4. The use of a flexible material such as a graphite sheet as the thermally conductive sheet 7 enables the thermally conductive sheet 7 to bend depending on the structure of each circuit block.

It is noted that the circuit block assemblies according to the exemplary embodiments of the present invention are described above. However, the present invention is not limited to the above circuit block assemblies, and the design thereof can be changed without departing from the spirit of the present invention.

For example, a circuit block assembly according to an exemplary aspect of the present invention may include a magnetic member on a surface that differs from the connected surface between the thermally conductive sheet 7 and the heat spreaders 6. The magnetic member further inhibits the radio frequency noise from being transmitted between the circuit blocks. According to an aspect, the magnetic member is a magnetic sheet.

Moreover, each circuit block assembly according to the present invention has a high heat dissipation, and the radio frequency noise is inhibited from being transmitted as described above. Accordingly, the circuit block assembly can be advantageously used for various electronic devices.

Accordingly, the present invention also provides an electronic device that includes a circuit block assembly according to the present invention.

According to an exemplary aspect, the thermally conductive sheet 7 of the circuit block assembly is thermally connected to the housing of the electronic device. Since the thermally conductive sheet is thermally connected to the housing of the electronic device, the heat dissipation is further improved.

According to the present invention, the following aspects are disclosed, although the present invention is not particularly limited thereto.

In one aspect, a circuit block assembly is provided that includes circuit blocks each of which includes a circuit board and a semiconductor element that is disposed on a first main surface of the circuit board. Moreover, each of the circuit blocks includes a heat spreader that is composed of a metal and that is connected to the semiconductor element directly or a thermally conductive member interposed therebetween. The circuit block assembly includes a thermally conductive sheet that is connected to the heat spreader directly or a thermally conductive member interposed therebetween. In addition, the thermally conductive sheet has a specific electrical resistance higher than a specific electrical resistance of the heat spreader.

In another exemplary aspect, the heat spreader is a vapor chamber that includes a housing having an interior space, a wick that is disposed in the interior space, and a working medium that is enclosed in the interior space.

In another exemplary aspect, an area of a surface of the thermally conductive sheet that faces each heat spreader is larger than a total area of a surface of each heat spreader that faces the thermally conductive sheet.

In another exemplary aspect, the thermally conductive sheet contains graphite.

In another exemplary aspect, a magnetic member is connected to a surface of the thermally conductive sheet that differs from a surface thereof that is connected to the heat spreader.

In another exemplary aspect, the semiconductor element is located near a first main surface of the heat spreader, and the thermally conductive sheet is located near a second main surface of the heat spreader.

In another exemplary aspect, the semiconductor element is located near a first main surface of the thermally conductive sheet, and the heat spreader is located near a second main surface of the thermally conductive sheet.

In another exemplary aspect, in one of the circuit blocks, the semiconductor element is located near a first main surface of the heat spreader, and the thermally conductive sheet is located near a second main surface of the heat spreader, and in another circuit block, the semiconductor element is located near a first main surface of the thermally conductive sheet, and the heat spreader is located near a second main surface of the thermally conductive sheet.

In another exemplary aspect, an electronic device is provided that includes a circuit block assembly that includes circuit blocks each of which includes a circuit board and a semiconductor element that is disposed on a first main surface of the circuit board. Each of the circuit blocks includes a heat spreader that is composed of a metal and that is thermally connected to the semiconductor element. The circuit block assembly includes a thermally conductive sheet that is thermally connected to the heat spreader. The thermally conductive sheet has a specific electrical resistance higher than a specific electrical resistance of the heat spreader.

In another exemplary aspect, the thermally conductive sheet of the circuit block assembly is thermally connected to a housing of the electronic device.

A circuit block assembly according to the present invention is configured for high heat dissipation, and a radio frequency noise is inhibited from being transmitted. Accordingly, the circuit block assembly can be advantageously used for various electronic devices, particularly, for a mobile device and a wearable device.

REFERENCE SIGNS LIST 1a, 1b, 1c . . . circuit block assembly
2 . . . circuit board, 3 . . . semiconductor element, 4 . . . circuit block, 5 . . . flexible cable
6 . . . heat spreader, 7 . . . thermally conductive sheet, 8 . . . other electric elements
11 . . . vapor chamber, 12 . . . first sheet, 13 . . . second sheet, 14 . . . housing
15 . . . support, 16 . . . interior space, 17 . . . wick, 18 . . . outer edge portion, 19 . . . projecting portion

The invention claimed is:
1. A circuit block assembly comprising:
a plurality of circuit blocks that each include a circuit board, a semiconductor element disposed on a main surface of the circuit board, and a heat spreader that is connected to the semiconductor element and configured to dissipate heat therefrom, wherein the heat spreader is composed of metal or a main part of the heat spreader is composed of metal;
at least one flexible cable that connects the circuit blocks to each other; and
a thermally conductive sheet that is connected to each heat spreader of each of the plurality of circuit blocks, wherein the thermally conductive sheet has a specific electrical resistance that is higher than a specific electrical resistance of each heat spreader, such that the thermally conductive sheet is configured to inhibit radio frequency noise from being transmitted between the plurality of circuit blocks.
2. The circuit block assembly according to claim 1, wherein the heat spreader of each of the circuit blocks is connected to the semiconductor element either directly or indirectly with a thermally conductive member interposed therebetween.
3. The circuit block assembly according to claim 1, wherein the thermally conductive sheet is connected to the heat spreader of each of the circuit blocks either directly or indirectly with a thermally conductive member interposed therebetween.

4. The circuit block assembly according to claim 1, wherein each heat spreader is a vapor chamber that includes the main part of the heat spreader as a housing having an interior space, a wick disposed in the interior space, and a working medium that is enclosed in the interior space.

5. The circuit block assembly according to claim 1, wherein the thermally conductive sheet comprises a surface area facing each heat spreader that is larger than a total area of a surface of the heat spreader of each of the circuit blocks that faces the thermally conductive sheet.

6. The circuit block assembly according to claim 1, wherein the thermally conductive sheet contains graphite.

7. The circuit block assembly according to claim 1, further comprising a magnetic member connected to a surface of the thermally conductive sheet that differs from a surface of the thermally conductive sheet that is connected to the heat spreader.

8. The circuit block assembly according to claim 1, wherein the semiconductor element of each circuit block is disposed adjacent to a first main surface of the heat spreader, and the thermally conductive sheet is disposed adjacent to a second main surface of the heat spreader that is opposite the first main surface of the heat spreader.

9. The circuit block assembly according to claim 1, wherein the semiconductor element of each circuit block is disposed adjacent to a first main surface of the thermally conductive sheet, and the heat spreader is disposed adjacent to a second main surface of the thermally conductive sheet that is opposite the first main surface of the thermally conductive sheet.

10. The circuit block assembly according to claim 1, wherein, in one of the plurality of circuit blocks, the semiconductor element is disposed adjacent to a first main surface of the heat spreader, and the thermally conductive sheet is disposed adjacent to a second main surface of the heat spreader that is opposite the first main surface of the heat spreader, and in a second of the plurality of circuit blocks, the semiconductor element is disposed adjacent to a first main surface of the thermally conductive sheet, and the heat spreader is disposed adjacent to a second main surface of the thermally conductive sheet that is opposite the first main surface of the thermally conductive sheet.

11. The circuit block assembly according to claim 1, wherein each of the plurality of circuit blocks is thermally connected to one another and electrically isolated from one another.

12. A circuit block assembly comprising:
a plurality of circuit blocks that each include a circuit board, a semiconductor element disposed on a main surface of the circuit board, and a heat spreader thermally connected to the semiconductor element and configured to dissipate heat therefrom, wherein the heat spreader is composed of metal or a main part of the heat spreader is composed of metal;
at least one flexible cable that connects the circuit blocks to each other; and
a thermally conductive sheet that is connected to each heat spreader of each of the plurality of circuit blocks and configured to further dissipate heat from the heat spreaders,
wherein the thermally conductive sheet comprises a surface area that faces each heat spreader that is larger than a total area of a surface of the respective heat spreader of each of the circuit blocks that faces the thermally conductive sheet.

13. The circuit block assembly according to claim 12, wherein the thermally conductive sheet has a specific electrical resistance that is higher than a specific electrical resistance of each heat spreader, such that the thermally conductive sheet is configured to inhibit radio frequency noise from being transmitted between the plurality of circuit blocks.

14. The circuit block assembly according to claim 12, wherein the heat spreader of each of the circuit blocks is connected to the semiconductor element either directly or indirectly with a thermally conductive member interposed therebetween.

15. The circuit block assembly according to claim 12, wherein the thermally conductive sheet is connected to the heat spreader of each circuit block either directly or indirectly with a thermally conductive member interposed therebetween.

16. The circuit block assembly according to claim 12, wherein each heat spreader is a vapor chamber that includes the main part of the heat spreader as a housing having an interior space, a wick disposed in the interior space, and a working medium that is enclosed in the interior space.

17. The circuit block assembly according to claim 12, wherein the semiconductor element of each circuit block is disposed adjacent to a first main surface of the heat spreader, and the thermally conductive sheet is disposed adjacent to a second main surface of the heat spreader that is opposite the first main surface of the heat spreader.

18. The circuit block assembly according to claim 12, wherein the semiconductor element of each circuit block is disposed adjacent to a first main surface of the thermally conductive sheet, and the respective heat spreader is disposed adjacent to a second main surface of the thermally conductive sheet that is opposite the first main surface of the thermally conductive sheet.

19. An electronic device comprising:
a circuit block assembly that includes a plurality of circuit blocks that each include a circuit board, a semiconductor element disposed on a first main surface of the circuit board, and a heat spreader that is thermally connected to the semiconductor element, wherein the heat spreader is composed of metal or a main part of the heat spreader is composed of metal; and
at least one flexible cable that connects the circuit blocks to each other,
wherein the circuit block assembly includes a thermally conductive sheet that is thermally connected to each heat spreader of each of the circuit blocks, and
wherein the thermally conductive sheet has a specific electrical resistance that is higher than a specific electrical resistance of each heat spreader, such that the thermally conductive sheet is configured to inhibit radio frequency noise from being transmitted between the plurality of circuit blocks.

20. The electronic device according to claim 19, further comprising a housing of the electronic device that is thermally connected to the thermally conductive sheet of the circuit block assembly.

* * * * *